US010930793B2

United States Patent
Chao et al.

(10) Patent No.: US 10,930,793 B2
(45) Date of Patent: Feb. 23, 2021

(54) BOTTOM CHANNEL ISOLATION IN NANOSHEET TRANSISTORS

(71) Applicant: International Business Machines Corporation, Armonk, NY (US)

(72) Inventors: Robin H. Chao, Wappingers Falls, NY (US); Choonghyun Lee, Rensselaer, NY (US); Chun W. Yeung, Niskayuna, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/493,730

(22) Filed: Apr. 21, 2017

(65) Prior Publication Data

US 2018/0308986 A1 Oct. 25, 2018

(51) Int. Cl.
*H01L 29/78* (2006.01)
*H01L 29/786* (2006.01)
(Continued)

(52) U.S. Cl.
CPC ........ *H01L 29/78696* (2013.01); *B82Y 10/00* (2013.01); *H01L 21/02* (2013.01); *H01L 21/02164* (2013.01); *H01L 21/02238* (2013.01); *H01L 21/02255* (2013.01); *H01L 21/2255* (2013.01); *H01L 29/0665* (2013.01); *H01L 29/0673* (2013.01); *H01L 29/1079* (2013.01); *H01L 29/42392* (2013.01); *H01L 29/6653* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/78603* (2013.01)

(58) Field of Classification Search
CPC ......... H01L 29/78696; H01L 29/78603; H01L 29/0665; H01L 21/02; H01L 29/66742; H01L 29/6653; H01L 29/42392; H01L 21/2255; H01L 21/02238; H01L 21/02164; H01L 29/66553; H01L 29/66545; H01L 21/02255
See application file for complete search history.

(56) References Cited

U.S. PATENT DOCUMENTS 5,963,817 A 10/1999 Chu et al.
6,251,751 B1 6/2001 Chu et al.
(Continued)

OTHER PUBLICATIONS

J. Kepa et al., "Thermally induced degradation of condensation-grown (100) Ge0.75Si0.25/SiO2 interfaces revealed by electron spin resonance," Applied Physics Letters, vol. 102, No. 12, 2013, 122104, 5 pages.
(Continued)

*Primary Examiner* — Charles D Garber
*Assistant Examiner* — S M Sohel Imtiaz
(74) *Attorney, Agent, or Firm* — Cantor Colburn LLP; Robert Sullivan

(57) ABSTRACT

Provided is a nanosheet semiconductor device. In embodiments of the invention, the nanosheet semiconductor device includes a channel nanosheet formed over a substrate. The nanosheet semiconductor device includes a buffer layer formed between the substrate and the channel nanosheet. The buffer layer has a lower conductivity than the channel nanosheet.

7 Claims, 9 Drawing Sheets

(51) Int. Cl.
   *H01L 21/225*   (2006.01)
   *H01L 21/02*    (2006.01)
   *H01L 29/06*    (2006.01)
   *H01L 29/423*   (2006.01)
   *H01L 29/66*    (2006.01)
   *B82Y 10/00*    (2011.01)
   *H01L 29/10*    (2006.01)
   *H01L 29/775*   (2006.01)

(56) References Cited

U.S. PATENT DOCUMENTS

| | | | |
|---|---|---|---|
| 7,019,364 B1* | 3/2006 | Sato | B82Y 20/00 257/347 |
| 7,601,570 B2 | 10/2009 | Damlencourt | |
| 7,700,446 B2 | 4/2010 | Anderson et al. | |
| 7,892,945 B2 | 2/2011 | Bedell et al. | |
| 7,973,389 B2 | 7/2011 | Rios et al. | |
| 8,084,308 B2 | 12/2011 | Chang et al. | |
| 8,106,459 B2 | 1/2012 | Change et al. | |
| 8,395,220 B2 | 3/2013 | Chang et al. | |
| 8,466,028 B2 | 6/2013 | Yin et al. | |
| 8,809,131 B2 | 8/2014 | Bangsaruntip et al. | |
| 8,859,389 B2 | 10/2014 | Kawasaki et al. | |
| 9,006,829 B2* | 4/2015 | Colinge | H01L 29/785 257/353 |
| 9,035,430 B2 | 5/2015 | Vega et al. | |
| 9,093,326 B2 | 7/2015 | Cheng et al. | |
| 9,123,790 B2 | 9/2015 | Pillarisetty et al. | |
| 9,129,829 B2 | 9/2015 | Kuhn et al. | |
| 9,276,064 B1 | 3/2016 | Zang et al. | |
| 9,324,812 B2 | 4/2016 | Yang et al. | |
| 9,748,404 B1 | 8/2017 | Chang et al. | |
| 2005/0070057 A1* | 3/2005 | Liu | H01L 21/823807 438/184 |
| 2005/0070078 A1* | 3/2005 | Daval | H01L 21/76254 438/542 |
| 2005/0181592 A1* | 8/2005 | Tweet | H01L 21/02502 438/602 |
| 2005/0199877 A1* | 9/2005 | Dip | H01L 21/31604 257/65 |
| 2007/0047899 A1* | 3/2007 | Khang | H01L 21/31604 385/147 |
| 2007/0111474 A1* | 5/2007 | Delattre | H01L 21/76254 438/459 |
| 2008/0135949 A1 | 6/2008 | Lo et al. | |
| 2012/0007052 A1 | 1/2012 | Hobbs et al. | |
| 2012/0138886 A1 | 6/2012 | Kuhn et al. | |
| 2012/0248583 A1 | 10/2012 | Kabe | |
| 2013/0270512 A1 | 10/2013 | Radosavljevic et al. | |
| 2014/0217364 A1 | 8/2014 | Chang et al. | |
| 2014/0225065 A1* | 8/2014 | Rachmady | H01L 29/42392 257/24 |
| 2014/0273412 A1* | 9/2014 | Wu | H01L 21/0206 438/478 |
| 2015/0034899 A1 | 2/2015 | Ching et al. | |
| 2015/0069328 A1 | 3/2015 | Leobandung | |
| 2015/0108572 A1* | 4/2015 | Cheng | H01L 21/845 257/347 |
| 2015/0333167 A1 | 11/2015 | Leobandung | |
| 2016/0027929 A1* | 1/2016 | Cheng | H01L 29/78696 257/9 |
| 2016/0104799 A1 | 4/2016 | Qi et al. | |
| 2017/0133495 A1* | 5/2017 | Cho | H01L 29/66742 |
| 2018/0308988 A1 | 10/2018 | Chao et al. | |

OTHER PUBLICATIONS

S. K. Wang et al., "Desorption kinetics of GeO from GeO2/Ge structure," Journal of Applied Physics, vol. 108, No. 5, 2010, 054104, 8 pages.

T. Tezuka et al.,"A Novel Fabrication Technique of Ultrathin and Relaxed SiGe Buffer Layers with High Ge Fraction for Sub-100 nm Strained Silicon-on-Insulator MOSFETs," 2001 Jpn. J. Appl. Phys. 40 2866.

W-S. Jung et al., "Characterization of Geometric Leakage Current of Isolation and Effect of Forming Gas Annealing in Germanium pn Junctions," IEEE Electron Device Letters, vol. 33, No. 11, 2012, pp. 1520-1522.

T. Tezuka, et al. "Fabrication of strained Si on an ultrathin SiGe-on-insulator virtual substrate with a high-Ge fraction"; Appl. Phys. Lett. 79, 1798 (2001).

F. A. Khaja et al., "Bulk FinFET junction isolation by heavy species and thermal implants," 20th International Conference on Ion Implantation Technology (IIT), 2014, 4 pages.

T. Hook, "FINFET isolation approaches and ramifications: Bulk vs. SOI," FDSOI Workshop, Hsinchu, Taiwan, Apr. 22, 2013, 25 slides.

List of IBM Patents or Patent Applications Treated as Related; (Appendix P), Date Filed Apr. 24, 2018; 2 pages.

Robin H. Chao, et al. Pending U.S. Appl. No. 15/960,703 entitled "Bottom Channel Isolation in Nanosheet Transistors," filed with the U.S. Patent and Trademark Office on Apr. 24, 2018.

Bao et al., "Oxide Isolated Fin-Type Field-Effect Transistors," U.S. Appl. No. 16/133,763, filed Sep. 18, 2018.

IBM "List of IBM Patents or Patent Applications Treated as Related; (Appendix P)", Filed Sep. 18, 2018, 2 pages.

\* cited by examiner and silicon germanium (SiGe) sacrificial nanosheets, implementation of the teachings recited herein are not limited to the particular FET architecture described herein. Rather, embodiments of the present invention are capable of being
BOTTOM CHANNEL ISOLATION IN NANOSHEET TRANSISTORS

BACKGROUND

The present invention relates in general to semiconductor device fabrication methods and resulting structures. More specifically, the present invention relates to bottom channel isolation in nanosheet transistors.

In semiconductor device fabrication processes, a large number of semiconductor devices, such as field effect transistors (FETs), can be fabricated on a single wafer. Some non-planar device architectures, such as nanosheet FETs, provide increased device density and can provide increased performance over lateral device architectures. In a known nanosheet FET configuration, the gate wraps around the full perimeter of multiple nanosheet channels in a so-called gate-all-around (GAA) configuration, which enables fuller depletion in the channel regions and reduces short-channel effects due to, for example, steeper subthreshold swing (SS) and smaller drain induced barrier lowering (DIBL). The wrap-around gate structure can result in greater management of leakage current and parasitic capacitance in the active regions, even as drive currents increase.

SUMMARY

One or more embodiments of the invention provide a nanosheet semiconductor device. The nanosheet semiconductor device includes a channel nanosheet formed over a substrate. The nanosheet semiconductor device includes a buffer layer formed between the substrate and the channel nanosheet. The buffer layer has a lower conductivity than the channel nanosheet.

One or more embodiments of the invention provide a method for forming a nanosheet semiconductor device. The method includes forming a buffer layer over a substrate. The method includes forming a nanosheet stack comprising channel nanosheets over the buffer layer such that a space is formed between a bottommost channel nanosheet in the nanosheet stack and the buffer layer. The method includes forming a dielectric layer in the space. After forming the dielectric layer in the space, the buffer layer has a lower conductivity than each of the channel nanosheets.

One or more embodiments of the invention provide a method for forming a nanosheet semiconductor device. The method includes forming a buffer layer over a substrate. The method includes forming a channel nanosheet over the buffer layer such that a space is formed between the channel nanosheet and the buffer layer. The method includes depositing an oxide layer on the buffer layer. After depositing the oxide layer on the buffer layer, the buffer layer has a lower conductivity than the channel nanosheet

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
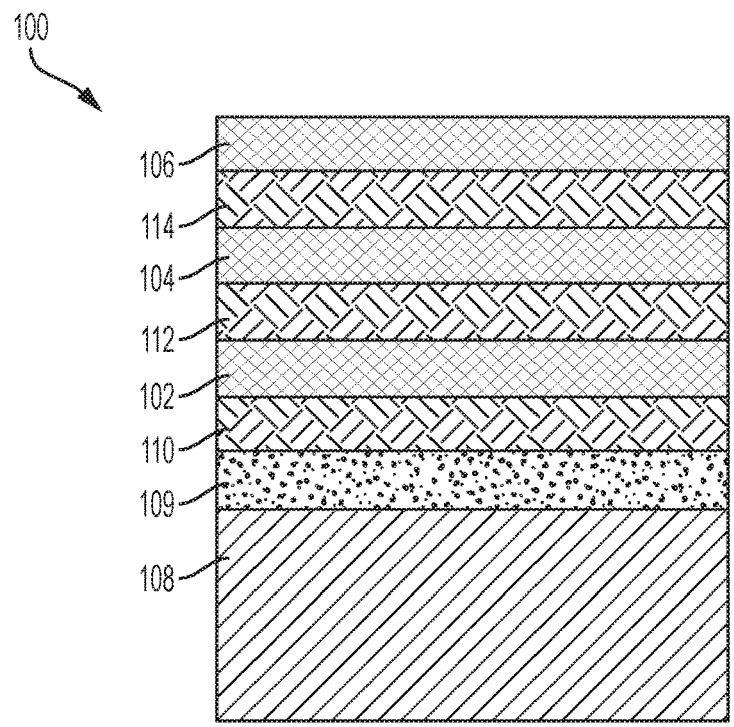
FIG. 1 depicts a cross-sectional view of a semiconductor structure after a fabrication operation according to one or more embodiments of the present invention.

It is understood in advance that although a detailed description is provided herein of an exemplary n-type "wrap-around" or "gate-all-around" (GAA) nanosheet FET architecture having silicon (Si) channel nanosheets and silicon germanium (SiGe) sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are silicon (Si) and the sacrificial nanosheets are silicon germanium (SiGe). For p-type FETs, the channel nanosheets are SiGe and the sacrificial nanosheets are Si. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer (nm) technology and below.

As previously noted herein, some non-planar transistor architectures such as the nanosheet FET employ semiconductor fins and side-gates that can be contacted outside the active region, resulting in increased device density over lateral devices. There are challenges, however, in providing nanosheet FETs with equal or superior performance characteristics to lateral devices. One such challenge is the mitigation or elimination of the parasitic capacitance associated with nanosheet FETs. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. In a nanosheet FET, a pathway for undesired capacitive coupling between the gate and the substrate can exist when the gate and the substrate are sufficiently close to each other. In known nanosheet FET configurations, the gate is spaced apart from the channel nanosheets and the substrate by a gate dielectric layer. Because it is desirable to use a relatively thin gate dielectric layer between the channel nanosheets and the gate to satisfy other nanosheet FET performance requirements (e.g., low voltage and low power dissipation), known nanosheet FET configurations having thin gate dielectric layers provide a pathway for unwanted capacitive coupling through the gate, the thin gate dielectric, and the substrate.

Another challenge associated with GAA nanosheet FETs is the difficulty in reducing undesirable effects such as short channel effects and punch-through (i.e., leakage currents). Punch-through occurs when an undesired current pathway is formed through a portion of the substrate under the channel and the gate. These undesired current pathways are referred to herein as under channel pathways, which allow leakage currents to pass from the source to the drain of the transistor, bypassing the nanosheets. Forming source/drain (S/D) regions that extend below an upper surface of the substrate (also known as recessed S/D regions), for example, contributes to the formation of an under channel pathway. S/D regions are commonly formed in a junction recess in the substrate in conventional GAA nanosheet FETs. Consequently, an upper region of the substrate between portions of the recessed S/D regions serves as an under channel pathway. When a voltage is applied to the gate of the nanosheet FET that is greater than a threshold voltage, current flows through the channel nanosheets and through the under channel pathway, reducing channel electrostatics control and ultimately degrading device performance. Consequently, it is desirable to suppress an under channel pathway from conducting undesired leakage currents. Conventional approaches to suppress these under channel pathways have not been wholly successful. In some conventional nanosheet FETs, for example, a surface portion of the substrate is doped using a punch-through-stopper (PTS) scheme to reduce the conductivity of the under channel pathway. The heavy doping associated with PTS, however, results in secondary consequences that degrade device performance (causing, e.g., stacking faults which lead to poor active channel epitaxial growth).

Turning now to an overview of aspects of the present invention, one or more embodiments of the invention provide fabrication methods and resulting structures that reduce unwanted capacitance between the gate and the substrate of a nanosheet FET by providing an isolation dielectric layer between the gate and the substrate. In an example fabrication method according to embodiments of the invention, vertically stacked channel nanosheets are epitaxially formed and/or grown over a buffer layer including both silicon and germanium, which is formed over a substrate. An oxide layer is formed over each of the nanosheet channels and on the buffer layer. The silicon in the buffer layer is then oxidized. In this manner, an isolation dielectric layer including a silicon oxide is formed between the gate and the substrate. The remaining oxide layer, i.e., on the channel nanosheets, is then removed. A gate dielectric layer is deposited on the channel nanosheets and on the isolation dielectric layer, and a gate material is deposited on the gate dielectric layer. Thus, the isolation dielectric layer increases a thickness of dielectric between the gate and the substrate and reduces capacitive coupling between the gate and the substrate.

Oxidizing silicon in the buffer layer to form the isolation dielectric layer also results in modifying the relative concentration of germanium in the buffer layer. The modified buffer layer has a lower conductivity than the channel nanosheets. Accordingly, when a voltage is applied to the gate of the nanosheet FET that is greater than a threshold voltage, current flows through the more conductive channel nanosheets, rather than the less conductive modified buffer layer. As current does not flow through the modified buffer layer, the modified buffer layer does not serve as an under channel pathway through which leakage current passes between S/D regions.

One or more embodiments of the invention also provide fabrication methods and resulting structures that prevent S/D regions from extending below an upper surface of the substrate. In particular, the S/D regions are formed in a junction recess in the buffer layer and the S/D regions are formed spaced apart from the substrate, with the buffer layer interposed between the S/D regions and the substrate. Accordingly, the buffer layer prevents recessed S/D regions and there is no region of the substrate between the S/D regions that can serve as an under channel pathway. Thus, current is reduced or prevented from passing between S/D regions through an upper region of the substrate. Fabrication methods and resulting semiconductor device structures in accordance with embodiments of the invention are described in detail below by referring to the accompanying drawings in FIGS. 1-10.

FIG. 1 depicts a cross-sectional view of a semiconductor structure after initial fabrication operations according to embodiments of the invention. The initial fabrication operations include forming a substrate 108, a buffer layer 109, and alternating layers of sacrificial nanosheets 110, 112, 114 and channel nanosheets 102, 104, and 106, configured and arranged as shown. The alternating layers of sacrificial nanosheets 110, 112, 114 and channel nanosheets 102, 104, and 106 are collectively referred to herein as a nanosheet stack. For ease of discussion, reference is made to operations performed on and to a nanosheet stack having three channel nanosheets (e.g., nanosheets 102, 104, and 106) alternating with three sacrificial nanosheets (e.g., sacrificial nanosheets 110, 112, 114). In some embodiments of the invention, the nanosheet stack can include any number of channel nanosheets alternating with any number of corresponding sacrificial nanosheets.

Non-limiting examples of suitable materials for the substrate 108 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

In some embodiments of the invention, the buffer layer 109 can be formed by epitaxial growth. The alternating series of sacrificial nanosheets 110, 112, 114 and channel nanosheets 102, 104, and 106 are formed by epitaxially growing one layer and then the next until the desired number and desired thicknesses of the nanosheets 110, 102, 112, 104, 114, 106 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments of the invention, the buffer layer 109 can be formed from a semiconductor material, including, for example, Si. In some embodiments of the invention, the buffer layer 109 can be formed from SiGe and can include a SiGe alloy layer. For example, the buffer layer 109 can be formed from SiGe having a Ge concentration from about 20 atomic percent to less than 40 atomic percent. In some embodiments of the invention, the buffer layer 109 can be formed from SiGe having a Ge concentration from about 10 atomic percent to about 30 atomic percent, or SiGe having a Ge concentration from about 10 atomic percent to about 20 atomic percent. The buffer layer 109 can have a uniform Ge content incorporated throughout the entire buffer layer 109, or the buffer layer 109 can have a graded Ge content that varies throughout the buffer layer 109. The buffer layer 109 can have a thickness of, for example, about 4 nm.

In some embodiments of the invention, the channel nanosheets 102, 104, and 106 are formed from silicon (Si), and the sacrificial nanosheets 110, 112, 114 are formed from silicon germanium (SiGe). The channel nanosheets 102, 104, and 106 can include, for example, monocrystalline Si. The channel nanosheets 102, 104, and 106 can have a thickness of, for example, from about 4 to about 10 nm, from about 4 to about 7 nm, or of about 7 nm. In embodiments where the sacrificial nanosheets 110, 112, 114 include SiGe, for example, SiGe having a Ge concentration of about 50 atomic percent. The sacrificial nanosheets 110, 112, 114 can have a thickness of, for example, about 12 nm. The substrate 108 can be a bulk semiconductor material that includes Si.

Figure 2:
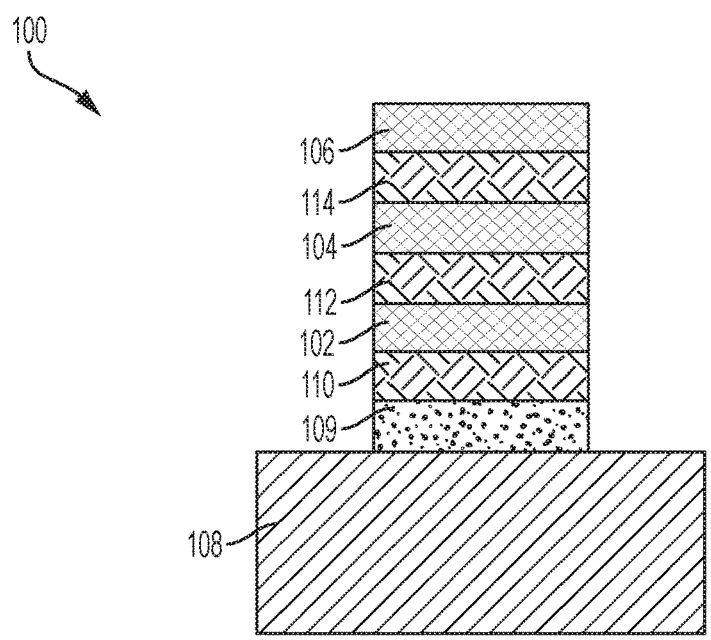
FIG. 2 depicts a cross-sectional view of the semiconductor structure after a fabrication operation according to one or more embodiments of the present invention.

FIG. 2 depicts a cross-sectional view of the semiconductor structure after patterning and removal of portions of the channel nanosheets 102, 104, and 106 and the sacrificial nanosheets 110, 112, 114 (i.e., the nanosheet stack) to expose portions of the substrate 108 during an intermediate fabrication operation according to one or more embodiments. The portions of the channel nanosheets 102, 104, and 106 and the sacrificial nanosheets 110, 112, 114 can be removed using, for example, a sidewall image transfer (SIT) operation, a wet etch process, or a dry etch process.

Figure 3A:
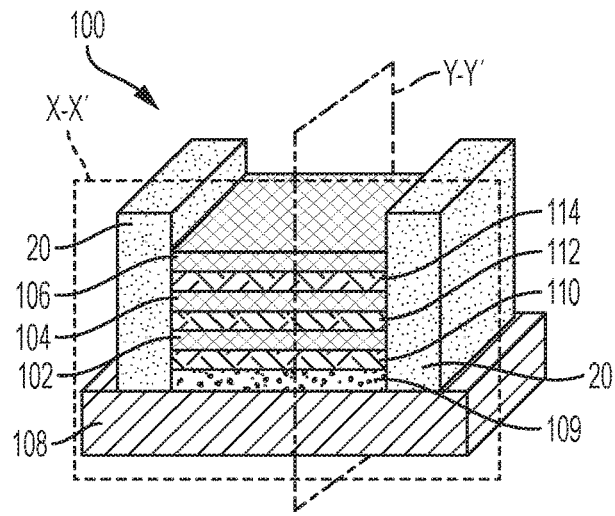
FIG. 3A depicts a perspective view of the semiconductor structure after a fabrication operation according to one or more embodiments of the present invention.
Figure 3B:
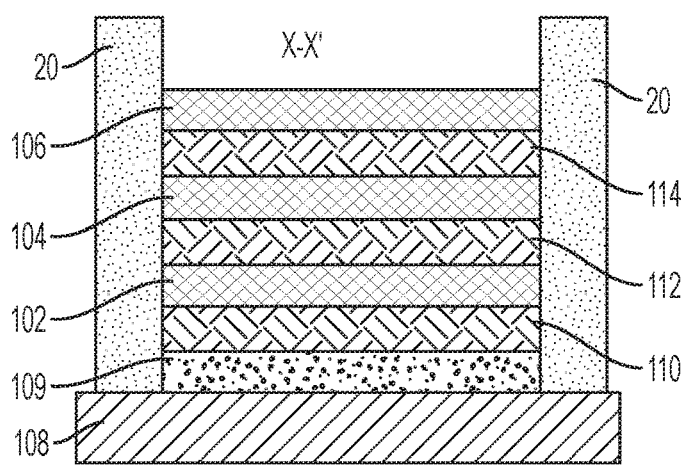
FIG. 3B depicts a cross-sectional view of the semiconductor structure shown in FIG. 3A, taken along line X-X'.
Figure 3C:
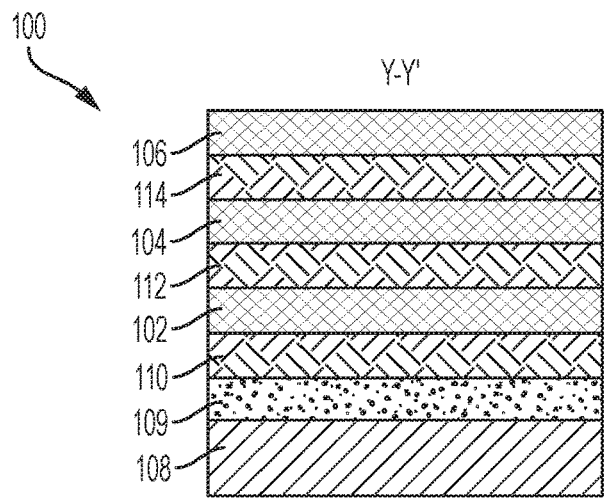
FIG. 3C depicts a cross-sectional view of the semiconductor structure shown in FIG. 3A, taken along line Y-Y'.

FIG. 3A depicts a perspective view of the semiconductor structure after formation of S/D regions 20. FIG. 3B depicts a cross-sectional view of the semiconductor structure shown in FIG. 3A taken along the line X-X'. FIG. 3C depicts a cross-sectional view of the semiconductor structure shown in FIG. 3A taken along the line Y-Y'.

The S/D regions 20 shown in the X-X' view of FIG. 3B can be formed using epitaxial growth processes of the type previously described herein. As previously described, materials can be epitaxially grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ and $1\times10^{21}$ cm$^{-3}$.

Figure 4A:
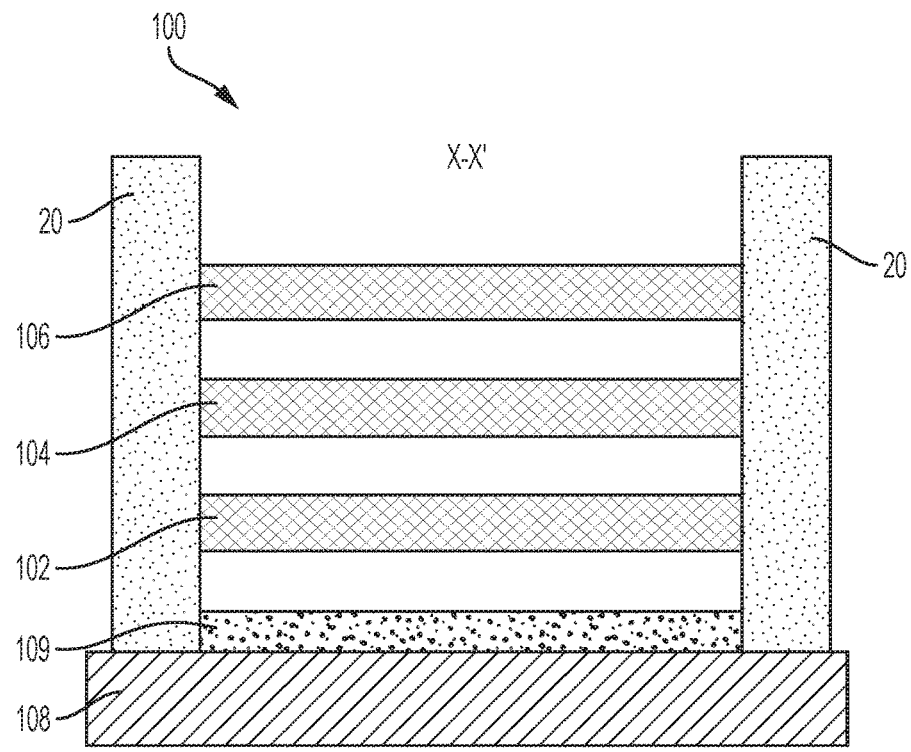
FIG. 4A depicts a cross-sectional view of the semiconductor structure, taken along line X-X', after a fabrication operation according to one or more embodiments of the present invention.
Figure 4B:
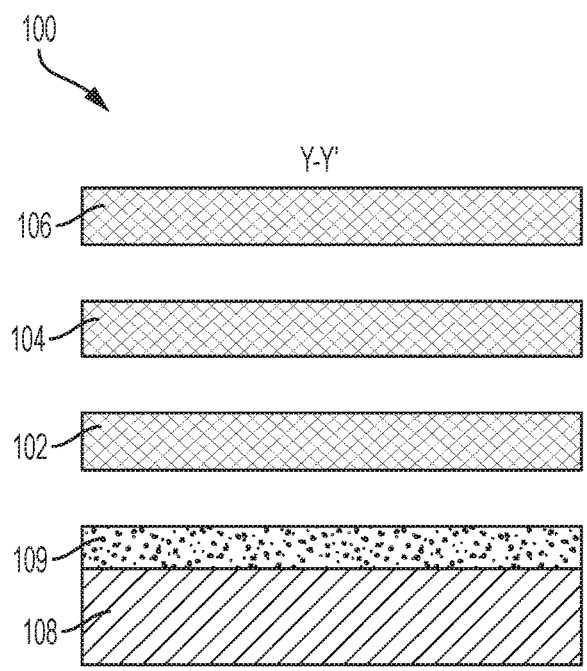
FIG. 4B depicts a cross-sectional view of the semiconductor structure, taken along line Y-Y', after a fabrication operation according to one or more embodiments of the present invention.

FIG. 4A depicts the X-X' view of the semiconductor structure after a fabrication operation according to one or more embodiments of the present invention. FIG. 4B depicts the Y-Y' view of the semiconductor structure after a fabrication operation according to one or more embodiments of the present invention. As depicted in FIG. 4A and FIG. 4B, in an operation referred to herein as a "channel release," the sacrificial nanosheets 110, 112, 114 have been removed by a known etching process, e.g., RIE, chemical oxide removal (COR), selective HCl gas etching, etc.

With further reference to FIGS. 3A, 3C, 4B, and FIGS. 6B, 7B, and 8B and 9, the channel nanosheets 102, 104, and 106 and the buffer layer 109 are illustrated as having a width equal to that of substrate 108 for ease of description and illustration. However, the substrate 108 can extend beyond the channel nanosheets 102, 104, and 106 and the buffer layer 109 in the Y-Y' direction, similar to the substrate 108 extending beyond the S/D regions 20 as depicted, for example, in FIGS. 3B, 4A, 5A, 6A, 7A, and 8A depicting X-X' views of the semiconductor structure.

Figure 5A:
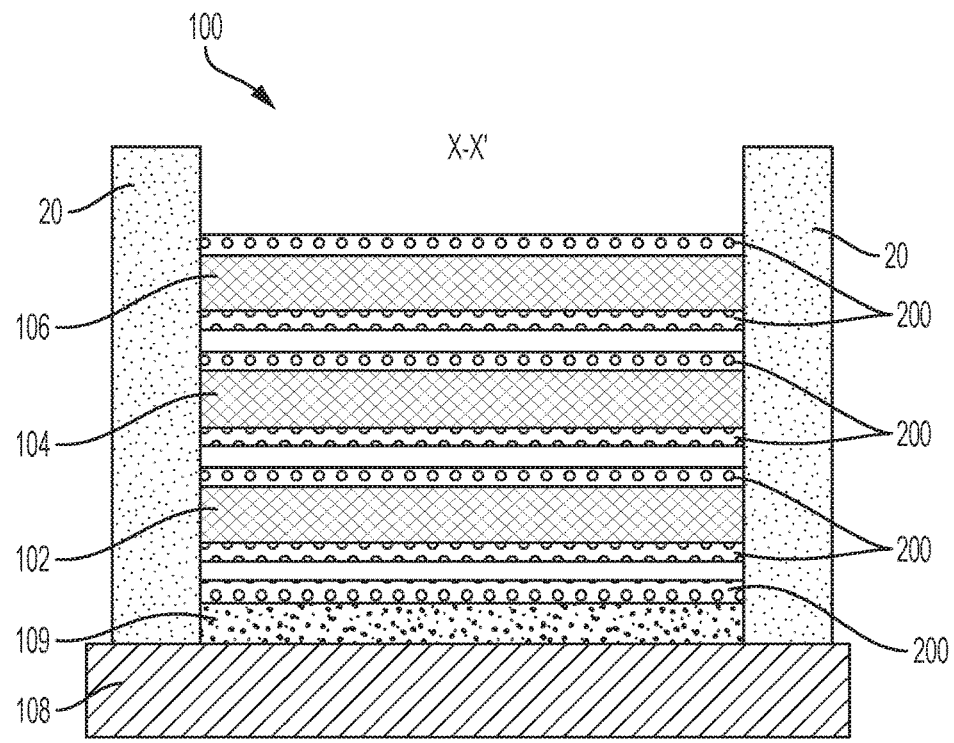
FIG. 5A depicts a cross-sectional view of the semiconductor structure, taken along line X-X', after a fabrication operation according to one or more embodiments of the present invention.
Figure 5B:
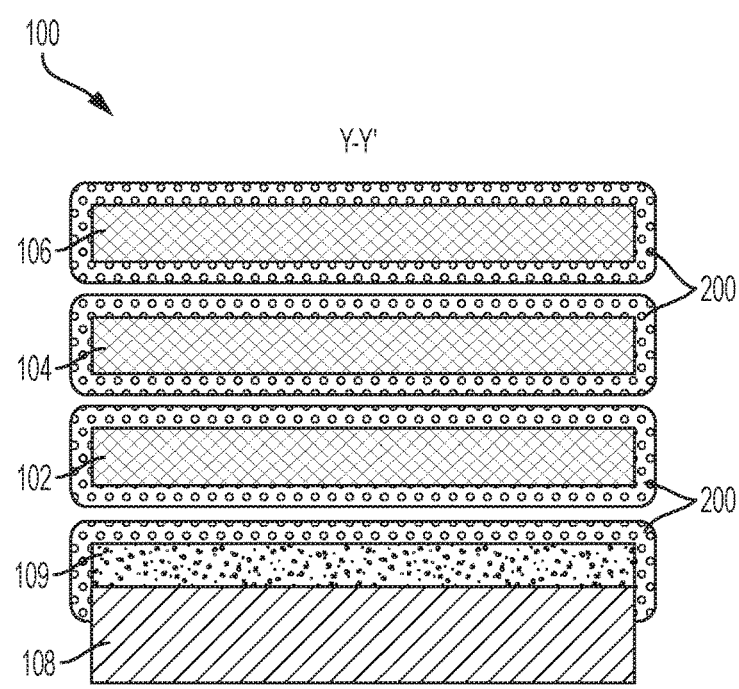
FIG. 5B depicts a cross-sectional view of the semiconductor structure, taken along line Y-Y', after a fabrication operation according to one or more embodiments of the present invention.

FIG. 5A depicts the X-X' view of the semiconductor structure after a fabrication operation according to one or more embodiments of the present invention. FIG. 5B depicts the Y-Y' view of the semiconductor structure after a fabrication operation according to one or more embodiments of the present invention. As depicted in FIG. 5A and FIG. 5B, a layer 200, which can be formed from an oxide, is formed on and around the channel nanosheets 102, 104, and 106. In some embodiments of the invention, the layer 200 includes germanium and oxygen. For example, the layer 200 can include GeO$_2$ and can have a thickness of about 5 nm. The layer 200 is also formed on and around the buffer layer 109. The layer 200 can additionally be formed on exposed upper portions of the substrate 108. In some embodiments of the invention, the layer 200 is formed by applying a uniform GeO$_2$ layer using, for example, an ALD operation.

Figure 6A:
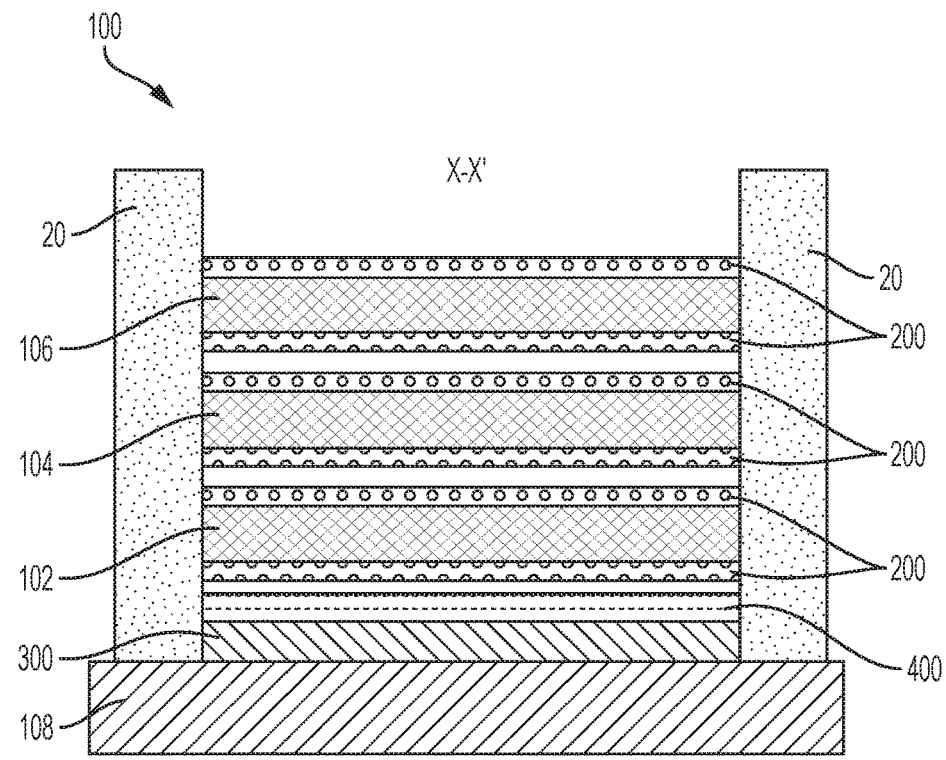
FIG. 6A depicts a cross-sectional view of the semiconductor structure, taken along line X-X', after a fabrication operation according to one or more embodiments of the present invention.
Figure 6B:
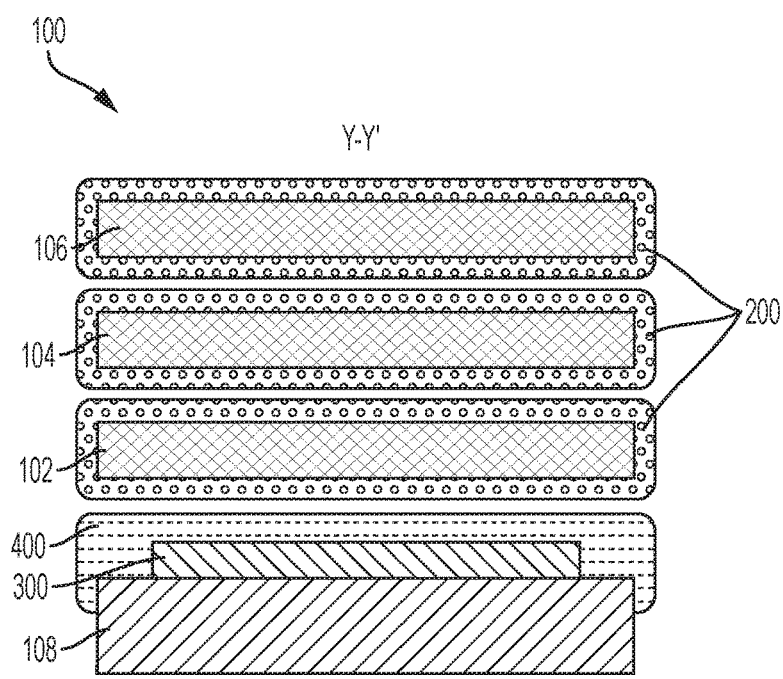
FIG. 6B depicts a cross-sectional view of the semiconductor structure, taken along line Y-Y', after a fabrication operation according to one or more embodiments of the present invention.

FIG. 6A depicts the X-X' view of the semiconductor structure after an annealing operation according to one or more embodiments of the present invention. FIG. 6B depicts the Y-Y' view of the semiconductor structure after the annealing operation according to one or more embodiments of the present invention. In some embodiments of the invention, the annealing operation is performed for about 30 seconds at a temperature of about 700° C. in an inert environment. In some embodiments of the invention, the inert environment is a nitrogen (N$_2$) environment.

As depicted in FIG. 6A and FIG. 6B, the annealing operation causes some of the Si in the buffer layer 109 to oxidize into the layer 200 and condenses Ge from layer 200 into the buffer layer 109, forming modified buffer layer 300 and layer 400. For example, in some embodiments of the invention the layer 200 includes GeO$_2$ and the buffer layer 109 includes SiGe having a Ge concentration of about 20 atomic percent, and the annealing operation causes Ge in the layer 200 to condense into the buffer layer 109 (forming, i.e., the modified buffer layer 300) and the Si in the buffer layer 109 to oxidize into the layer 200 (forming, i.e., the layer 400) according to the following reaction scheme (I):

$$Si + Ge + 2GeO_2 \rightarrow SiO_2 + Ge + 2GeO \qquad (I)$$

Volatile species GeO can be extracted, for example, by purging a chamber in which the reaction is conducted with an inert gas.

Consequently, the layer 400 includes SiO$_2$ and the modified buffer layer 300 includes an increased concentration of Ge as compared to the buffer layer 109. Increasing the Ge concentration of SiGe reduces the conductivity of the SiGe. Thus, the modified buffer layer 300 has a reduced conductivity relative to the buffer layer 109.

As also depicted in FIG. 6A and FIG. 6B, the annealing operation does not convert the layer 200 around the channel nanosheets 102, 104, and 106. As previously described, Si, Ge, and GeO$_2$ react to form SiO$_2$, Ge, and volatile species GeO. The channel nanosheets 102, 104, and 106 do not contain Ge, which is required to form SiO$_2$, and consequently, the layer 200 around the channel nanosheets 102, 104, and 106 does not react with the Si in the channel nanosheets 102, 104, and 106. Accordingly, layer 400 can be formed over the substrate 108, and the layer 200 remaining around the channel nanosheets 102, 104, and 106 can be removed.

In some embodiments of the invention, the buffer layer 109 can include SiGe having a Ge concentration of less than about 40 atomic percent. For example, in some embodiments, the buffer layer 109 can include SiGe having greater than about 20 percent Ge, and the modified buffer layer 300 can include greater than about 40 percent Ge. In some embodiments of the invention, the buffer layer 109 can include SiGe having a Ge concentration from about 10 atomic percent to about 30 atomic percent, and the modified buffer layer 300 can include SiGe having a Ge concentration from about 15 atomic percent to about 35 atomic percent.

In some embodiments of the invention, buffer layer 109 is retained under modified buffer layer 300 after annealing but with a reduced thickness (not depicted). For example, a buffer layer 109 including SiGe having a Ge concentration of about 20 atomic percent can have a thickness of about 20 nm. A layer 200 including GeO$_2$ is formed on the buffer layer 109. The layer 200 can have a thickness of about 5 nm. Annealing forms a layer 400 including SiO$_2$ on a modified buffer layer 300 including SiGe having a Ge concentration of about 30 atomic percent. The modified buffer layer 300 is formed on a retained buffer layer 109 including SiGe having a Ge concentration of about 20 atomic percent. The layer 400 has a thickness of about 5 nm, the modified buffer layer 300 has a thickness of about 3 nm, and the retained buffer layer 109 has a thickness of about 16 nm.

Figure 7A:
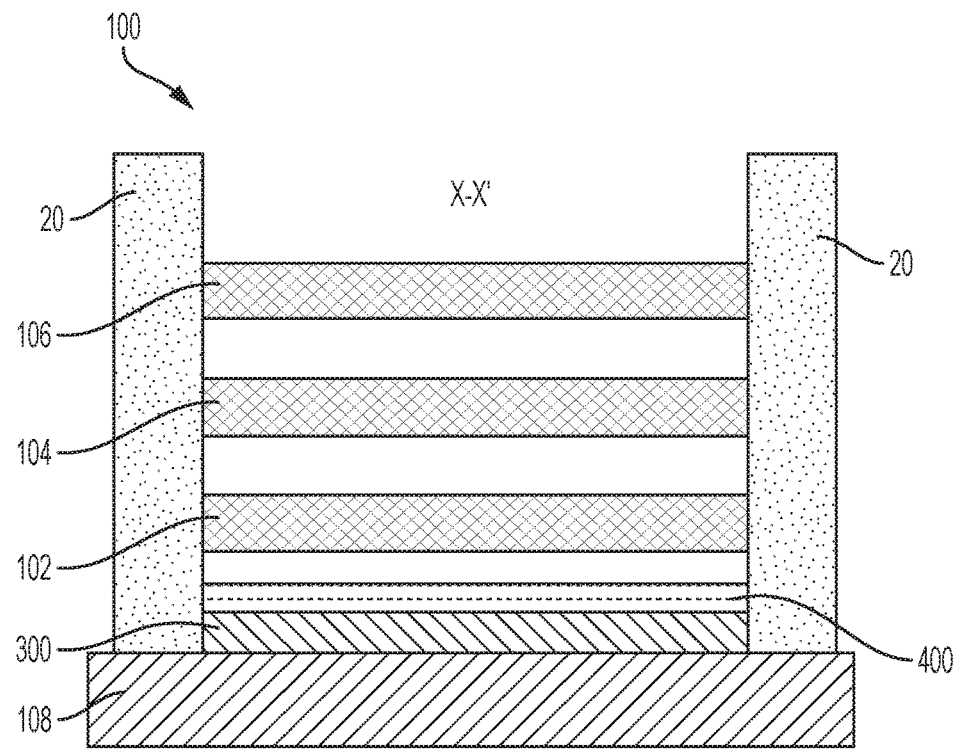
FIG. 7A depicts a cross-sectional view of the semiconductor structure, taken along line X-X', after a fabrication operation according to one or more embodiments of the present invention.
Figure 7B:
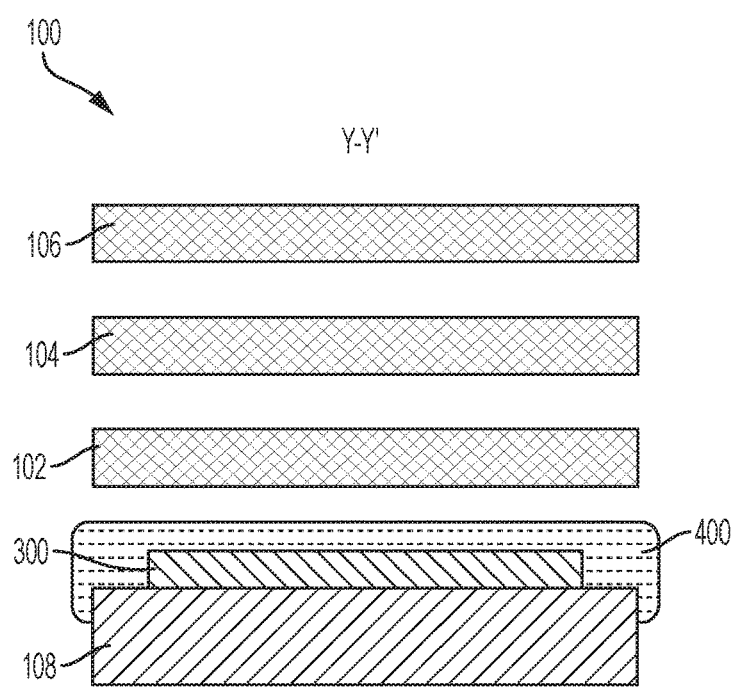
FIG. 7B depicts a cross-sectional view of a semiconductor structure, taken along line Y-Y', after a fabrication operation according to one or more embodiments of the present invention.

FIG. 7A depicts the X-X' view of the semiconductor structure after a fabrication operation according to one or more embodiments of the present invention. FIG. 7B depicts the Y-Y' view of the semiconductor structure after a fabrication operation according to one or more embodiments of the present invention. As depicted in FIGS. 7A and 7B, the layers 200 (as depicted in FIGS. 6A and 6B) around the channel nanosheets 102, 104, and 106 have been removed. The layers 200, which can include unreacted GeO$_2$, can be removed, for example, using deionized water.

In some embodiments of the invention, a thickness of the buffer layer 109 (depicted in FIGS. 5A and 5B) including SiGe having a Ge concentration of about 20 atomic percent can be about 4 nm. Following removal of the layers 200 around the channel nanosheets 102, 104, and 106, a distance between a bottommost channel nanosheet 102 and the layer 400 can be about 9 nm. A thickness of the layer 400 can be from about 4.5 to about 5.5 nm, or of about 5 nm, and the modified buffer layer 300 can have a thickness from about 1 to about 3 nm, from about 1.5 to about 2.5 nm, or of about 2 nm.

Figure 8A:
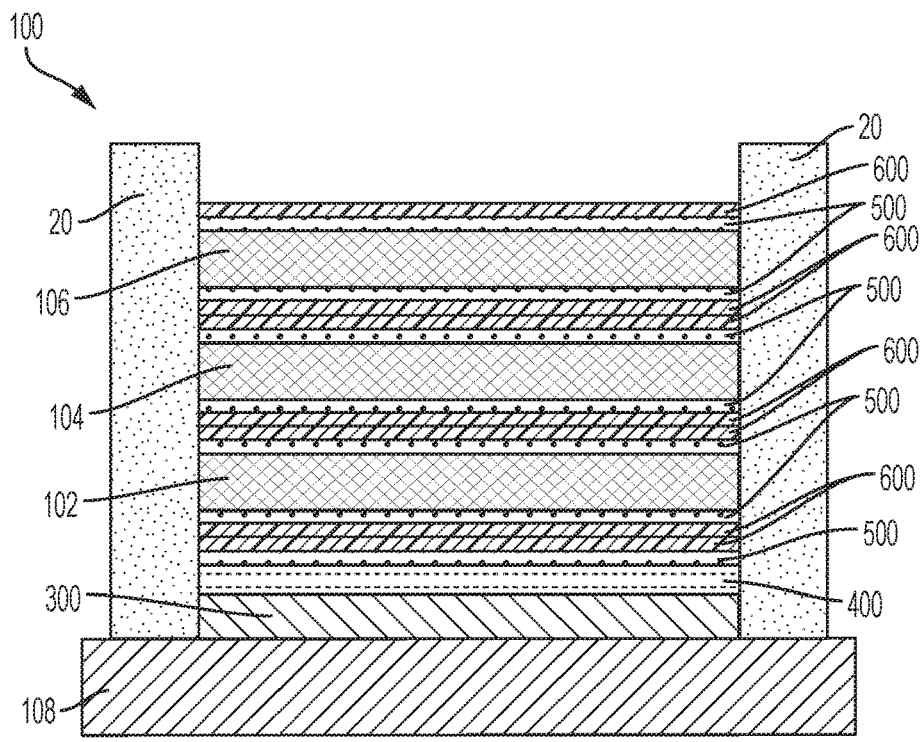
FIG. 8A depicts a cross-sectional view of the semiconductor structure, taken along line X-X', after a fabrication operation according to one or more embodiments of the present invention.
Figure 8B:
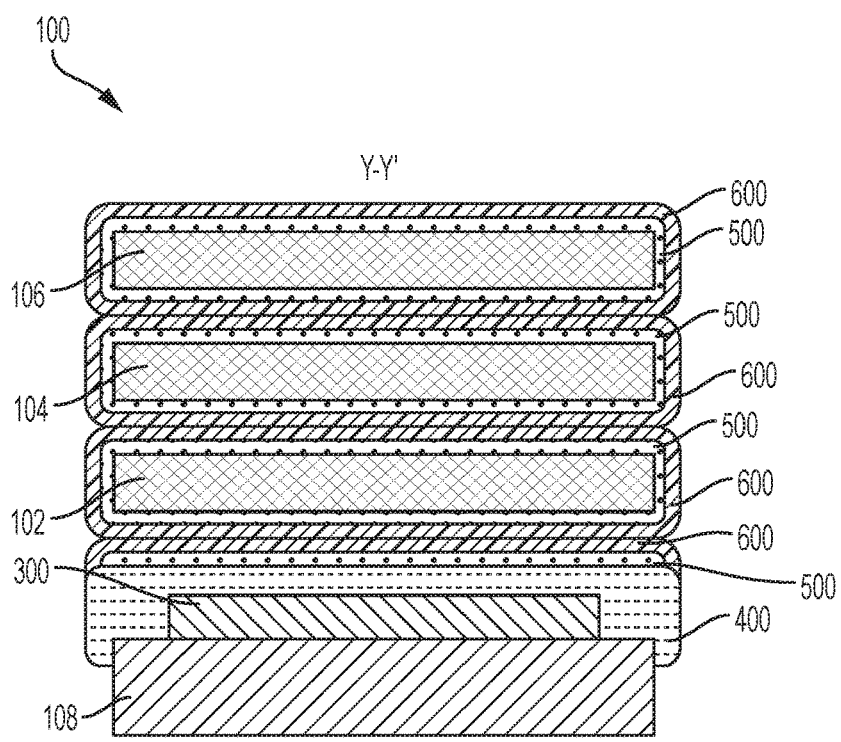
FIG. 8B depicts a cross-sectional view of the semiconductor structure, taken along line Y-Y', after a fabrication operation according to one or more embodiments of the present invention.

FIG. 8A depicts the X-X' view of the semiconductor structure after a fabrication operation according to one or more embodiments of the present invention. FIG. 8B depicts the Y'Y' view of the semiconductor structure after a fabrication operation according to one or more embodiments of the present invention. As depicted in FIGS. 8A and 8B, a high-k dielectric 500 and a gate material 600 are formed on the layer 400 as well as around the channel nanosheets 102, 104, and 106. The layer 400 reduces capacitive coupling between the gate material 600 and the substrate 108 by providing an increased thickness of dielectric between the gate material 600 and the substrate 108, as compared to the high-k dielectric 500 and the gate material 600 being formed directly on the substrate 108 as well as around the channel nanosheets 102, 104, and 106.

In some embodiments, the high-k dielectric 500 modifies the work function of the gate material 600. The high-k dielectric 500 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric 500 can have a thickness of from about 0.5 nm to about 4 nm. In some embodiments, the high-k dielectric 500 can have a thickness of from about 2 nm to about 3 nm, although other thicknesses are within the contemplated scope of the invention.

The gate material 600 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In some embodiments, a work function layer (not depicted) is formed between the high-k dielectric 500 and the gate material 600. The work function layer can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layer further modifies the work function of the gate material 600.

As previously described, the modified buffer layer 300 can include SiGe having a Ge concentration of about 30 atomic percent and have a thickness of about 2 nm. SiGe is less conductive than Si. The modified buffer layer 300 has poor conductivity relative to channel nanosheets 102, 104, and 106, which are formed from Si. Accordingly, when a voltage is applied to the gate material 600 of the nanosheet FET that is greater than a threshold voltage, current flows through the more conductive channel nanosheets 102, 104, and 106 formed from Si, rather than the less conductive modified buffer layer 300. As current does not flow through the modified buffer layer 300, the modified buffer layer 300 does not serve as an under channel pathway through which leakage current passes between S/D regions 20.

Figure 9:
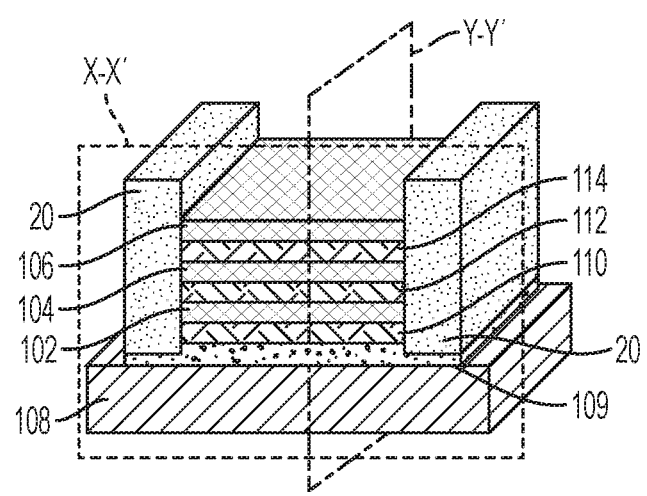
FIG. 9 depicts a perspective view of a semiconductor structure after a fabrication operation according to one or more embodiments of the present invention.

FIG. 9 depicts a perspective view of a semiconductor structure after initial fabrication operations and the formation of S/D regions 20 according to one or more embodiments of the invention. FIG. 9 corresponds to previously described FIG. 3A, but as depicted in FIG. 9, in some embodiments of the invention, the S/D regions 20 can be formed on the buffer layer 109. In other words, the buffer layer 109 can extend beneath the S/D regions 20. The operations applied to the structure of FIGS. 3A, 3B, and 3C as previously described, i.e., the operations depicted in FIGS. 4A, 4B, 5A, 5B, 6A, 6B, 7A, 7B, 8A, and 8B, are applied to the structure depicted in FIG. 9.

Formation of the S/D regions 20 on the buffer layer 109 prevents the S/D regions 20 from extending below an upper surface of the substrate 108. In particular, the S/D regions are formed in a junction recess in the buffer layer and the S/D regions 20 are formed spaced apart from the substrate 108, with the buffer layer 109 interposed between the S/D regions 20 and the substrate 108. Accordingly, the buffer layer prevents recessed S/D regions and there is no region of the substrate 108 between the S/D regions that can serve as an under channel pathway. Thus, leakage current is reduced or prevented from passing between S/D regions through an upper region of the substrate 108.

Figure 10:
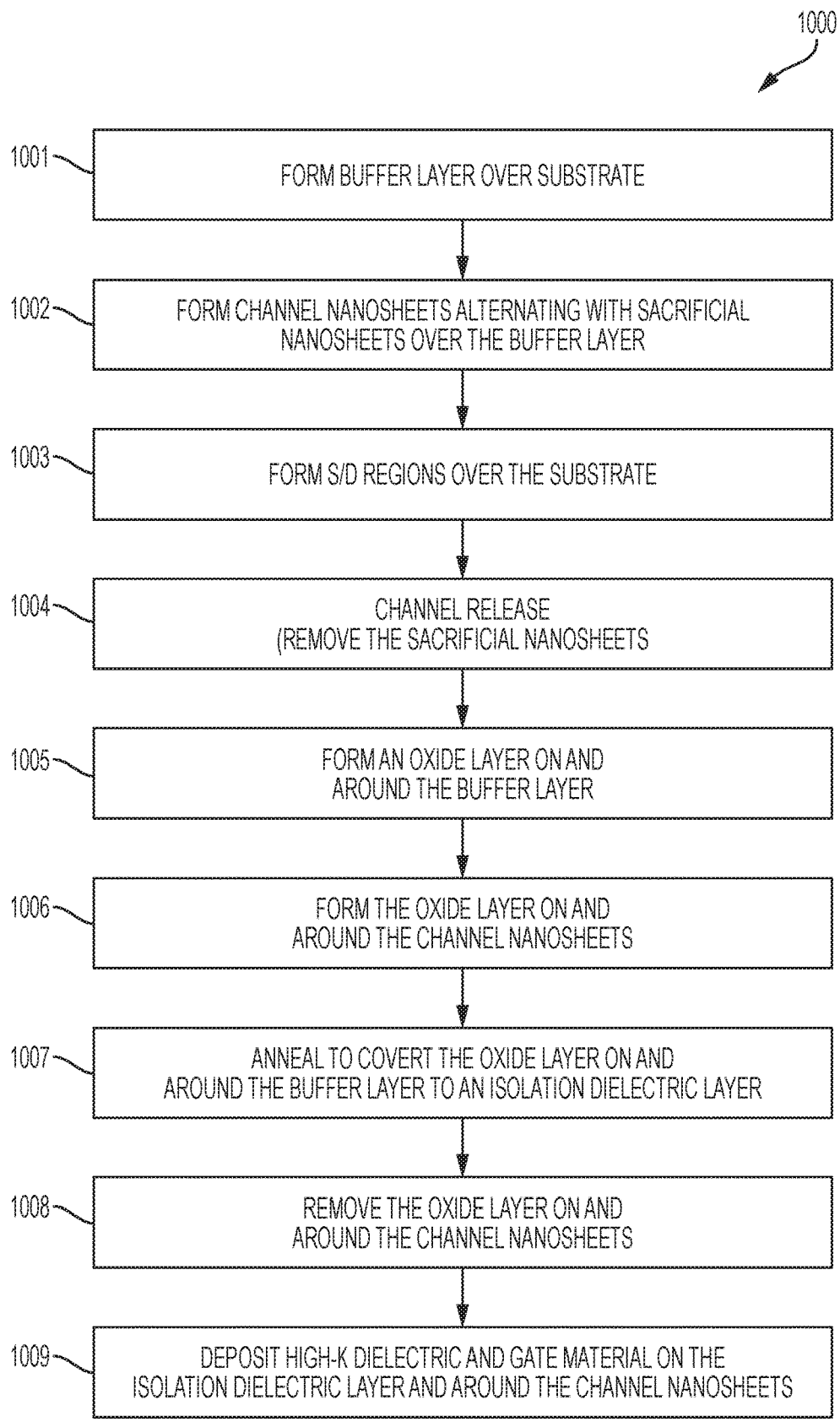
FIG. 10 depicts a flow diagram illustrating a methodology according to one or more embodiments of the present invention.

FIG. 10 depicts a flow diagram illustrating a methodology 1000 according to one or more embodiments of the present invention. As depicted in FIG. 10, the methodology 1000 begins at block 1001 with forming a buffer layer over a substrate. At block 1002, channel nanosheets alternating with sacrificial nanosheets are formed over the buffer layer. At block 1003, S/D regions are formed over the substrate, for example, on the buffer layer. At block 1004, the sacrificial nanosheets are removed, e.g., released from the channel nanosheets. At block 1005, an oxide layer is formed on and around the buffer layer. At block 1006, the oxide layer is formed on and around the channel nanosheets. Block 1006 can be performed simultaneously with block 1005. The oxide is chosen to provide a selective oxidation of a material in the buffer layer during a subsequent annealing (block 1007). For example, the buffer layer can include SiGe and the oxide layer can include $GeO_2$, and the $GeO_2$ can selectively oxidize Si in the SiGe buffer layer. Block 1007 annealing converts the oxide layer on and around the buffer layer to an isolation dielectric layer. For example, the $GeO_2$ layer selectively oxidizing Si in the SiGe buffer layer results in a $SiO_2$ isolation dielectric layer. At block 1008, the oxide layer on and around the channel nanosheets is removed. At block 1009, high-k dielectric and gate material are deposited on the isolation dielectric layer and around the channel nanosheets. The isolation dielectric layer provides an increased thickness of dielectric between the gate material and the substrate.

The flow diagram depicted herein is just one example. There can be many variations to this diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

The invention claimed is:

1. A method for forming a nanosheet semiconductor device, the method comprising:
    forming a buffer layer comprising epitaxial silicon and germanium over a substrate, the buffer layer comprising a germanium concentration of about 10 atomic percent to about 30 atomic percent;
    forming a nanosheet stack comprising alternating layers of silicon channel nanosheets and silicon germanium sacrificial nanosheets;
    selectively removing the sacrificial nanosheets such that a space is formed between adjacent channel nanosheets and between a bottommost channel nanosheet in the nanosheet stack and the buffer layer;
    forming a first dielectric layer in the space on the buffer layer and on a surface of the channel nanosheets, wherein forming the first dielectric layer in the space partially fills the space, and wherein the first dielectric layer comprises germanium oxide;
    annealing the substrate and the first dielectric layer at a temperature of about 700° C. for about 30 seconds in an inert environment to form a modified buffer layer and a dielectric isolation layer on a surface of the modified buffer layer by reacting an uppermost portion of the buffer layer with the first dielectric layer, the modified buffer layer comprising an increased germanium concentration relative to the buffer layer, the modified buffer layer having a lower conductivity than each of the channel nanosheets, wherein the buffer layer is retained under the modified buffer layer, wherein the channel nanosheets and the first dielectric on the surface of the channel nanosheets are not reactive during the annealing, and wherein the dielectric isolation layer comprises silicon dioxide;
    selectively removing the first dielectric layer from the surface of channel nanosheets; and
    forming a high k dielectric material around the channel nanosheets and a gate material around the high k dielectric material, wherein the high k dielectric material is on an uppermost surface of the dielectric isolation layer, and the gate material is on the high k dielectric material.

2. The method of claim 1, wherein annealing is performed in an inert gas environment.

3. The method of claim 1, wherein annealing to form the modified buffer layer is according to reaction scheme:

$$Si+Ge+2GeO_2 \rightarrow SiO_2+Ge+GeO.$$

4. The method of claim 3, wherein annealing to form the modified buffer layer comprises increasing a concentration of the germanium in the buffer layer.

5. The method of claim 3, wherein reacting the buffer layer with the first dielectric layer comprises oxidizing silicon in the buffer layer to form the silicon dioxide in the dielectric isolation layer.

6. The method of claim 1, wherein after annealing, a concentration of germanium in the buffer layer is increased such that the buffer layer comprises from about 15 atomic percent germanium to about 35 atomic percent germanium.

7. The method of claim 1 further comprising forming source and drain regions on the buffer layer, the nanosheet stack being between the source and drain regions.

* * * * *